(12) United States Patent
Kang et al.

(10) Patent No.: US 6,963,108 B1
(45) Date of Patent: Nov. 8, 2005

(54) RECESSED CHANNEL

(75) Inventors: Inkuk Kang, Saratoga, CA (US); Hiroyuki Kinoshita, Sunnyvale, CA (US); Jeff P. Erhardt, San Jose, CA (US); Emmanuil H. Lingunis, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/683,631

(22) Filed: Oct. 10, 2003

(51) Int. Cl.[7] ............................................. H01L 29/78
(52) U.S. Cl. .................. 257/330; 257/343; 438/270; 438/272; 438/287; 438/288; 438/589
(58) Field of Search ............................... 257/324, 330, 257/343; 438/215, 270–272, 287, 288, 291, 438/589, 593

(56) References Cited

U.S. PATENT DOCUMENTS

| | | | | |
|---|---|---|---|---|
| 4,003,126 A | * | 1/1977 | Holmes et al. | 438/282 |
| 4,243,997 A | * | 1/1981 | Natori et al. | 257/330 |
| 4,256,514 A | | 3/1981 | Pogge | 438/361 |
| 5,583,065 A | * | 12/1996 | Miwa | 438/304 |
| 5,854,501 A | * | 12/1998 | Kao | 257/316 |
| 5,960,271 A | * | 9/1999 | Wollesen et al. | 438/197 |
| 6,025,626 A | * | 2/2000 | Tempel | 257/315 |
| 6,528,847 B2 | * | 3/2003 | Liu | 257/330 |
| 6,661,053 B2 | * | 12/2003 | Willer et al. | 257/329 |
| 6,800,899 B2 | * | 10/2004 | Gonzalez | 257/330 |
| 2002/0024092 A1 | * | 2/2002 | Palm et al. | 257/330 |

FOREIGN PATENT DOCUMENTS

GB 2011175 A * 7/1979 ........... H01L 27/10

* cited by examiner

Primary Examiner—Allan R. Wilson
(74) Attorney, Agent, or Firm—Renner, Otto, Boisselle & Sklar, LLP

(57) ABSTRACT

A memory cell with reduced short channel effects is described. A trench region is formed in a semiconductor substrate. A source region and a drain region are formed on opposing sides of the trench region, wherein a bottom of the source region and a bottom of the drain region are above a floor of the trench region. A gate dielectric layer is formed in the trench region of the semiconductor substrate between the source region and the drain region. A recessed channel region is formed below the trench region, the source region and the drain region. A control gate is formed on the semiconductor substrate above the recessed channel region, wherein the control gate is separated from the recessed channel region by the gate dielectric layer.

35 Claims, 8 Drawing Sheets

RECESSED CHANNEL

TECHNICAL FIELD

The present invention relates generally to flash memory devices and methods of forming the same and, more particularly, to flash memory having reduced short channel effects and methods for forming the same.

BACKGROUND OF THE INVENTION

A pervasive trend in modern integrated circuit manufacture is to produce semiconductor devices, such as memory cells, that are as small as possible. A typical memory cell, which generally is formed from a field effect transistor (FET), includes a source and a drain formed in an active region of a semiconductor substrate by implanting N-type or P-type impurities in the semiconductor substrate. Disposed between the source and the drain is a channel (or body) region. Disposed above the body region is a gate electrode. The gate electrode and the body are spaced apart by a gate dielectric layer. It is noted that memory cells can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. In FET devices with a channel having a relatively short length, the FET can experience a number of undesirable electrical characteristics referred to as short channel effect (SCE). SCE generally occur when the gate does not have adequate control over the channel region, and can include threshold voltage ($V_t$) roll-off, off current (Ioff) roll-up and drain induced barrier lowering (DIBL). As the physical dimensions decrease, SCE can become more severe. SCE is the result of intrinsic properties of the crystalline materials used in the FET devices. Namely, the band gap and built-in potential at the source/body and drain/body junctions are non-scalable with the reduction of physical device dimensions, such as a reduction in channel length.

Another problem due to downscaling of transistors is charge loss in the oxide-nitride-oxide (ONO) layer. Charge loss is due in part to ONO damage during an erase cycle. During the erase cycle, the relatively high voltage (Vpp) applied across the oxide causes tunneling of electrons from the charge trapping nitride layer to the drain region. At the same time, the high voltage could cause holes from the drain to be injected into the oxide. These holes can degrade the performance of the oxide by creating a leakage path in the oxide between the drain and the nitride layer.

Since the oxide is the barrier for electrons traveling to and from the charge trapping layer, the charging and discharging current of a memory cell depends on the voltage applied across the oxide layer, I=C(dv/dt). Therefore, the voltage applied across the oxide has a direct effect on electron tunneling and is the main cause of undesirable hole injection into the oxide during an erase operation.

Therefore, there exists a need in the art for semiconductor devices, such as memory cells, that have reduced SCE and for fabrication techniques to make those semiconductor devices. Furthermore, there is a need in the art for semiconductor devices that have reduced ONO damage during erase operations of the device.

SUMMARY OF THE INVENTION

In the light of the foregoing, one aspect of the invention relates to a memory-cell that includes a semiconductor substrate having at least one trench formed in a surface thereof, and a recessed channel region of a first conductivity type semiconductor is formed in the semiconductor substrate below each trench. A source region and a drain region both of a second conductivity type semiconductor formed in the semiconductor substrate on opposing sides of each trench, wherein a bottom of the source region and a bottom of the drain region are above a floor of the trench. A gate dielectric layer is formed on the semiconductor substrate, the gate dielectric layer being formed along the bottom and sidewalls of the trench, and a control gate is formed over the gate dielectric layer above the recessed channel region.

A second aspect of the invention relates to a method of fabricating a memory cell and includes the steps of forming at least one trench in a semiconductor substrate. A recessed channel region of a first conductivity type semiconductor is formed in the semiconductor substrate at the bottom of each trench. A source region and a drain region both of a second conductivity type semiconductor are formed in the semiconductor substrate on opposing sides of each trench, wherein a bottom of the source region and a bottom of the drain region are above a floor of the trench. A gate dielectric layer is formed on the semiconductor substrate, the gate dielectric layer being formed along the bottom and sidewalls of the trench, and a control gate is formed over the gate dielectric layer above the recessed channel region.

A third aspect of the invention relates to a method of erasing a memory cell and includes the steps of applying a negative potential to a control gate, and applying a positive potential to a drain, wherein the negative potential and the positive potential produce hot hole tunneling from the drain to a charge trapping layer through an insulation layer.

Other aspects, features, and advantages of the invention will become apparent from the following detailed description. It should be understood, however, that the detailed description and specific examples, while indicating several embodiments of the present invention, are given by way of illustration only and various modifications may naturally be performed without deviating from the present invention.

DESCRIPTION

Figure 1:
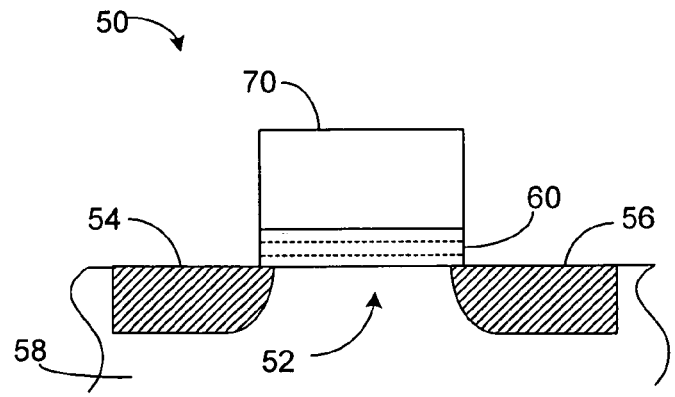
FIG. 1 is a cross-sectional view of a prior art memory cell.

The following is a description of the present invention in conjunction with the attached drawings, wherein like reference numerals will refer to like elements throughout.

Referring to FIG. 1, a conventional memory cell 50 is illustrated. The memory cell 50 includes a source region 54 and a drain region 56 in a semiconductor substrate 58. A gate dielectric layer 60 is disposed over the substrate 58 and a control gate 70 is disposed over the gate dielectric layer 60. A channel 52 is defined by the region beneath the control gate 70 and between the source region 54 and the drain region 56.

As is known by those having ordinary skill in the art, as a FET (e.g., memory cell) is downscaled, the channel length of the FET is reduced in length and the FET experiences undesirable electrical characteristics known as short channel effect (SCE). SCE is an undesired phenomenon in which as the channel length decreases, the area affected by a drain voltage increases to cover an area immediately below a gate electrode, pulling down the potential of the semiconductor substrate surface and resulting in variations of threshold voltage and reduction in the actual channel length. SCE becomes more severe as the device physical dimensions and, more specifically, as the FET channel length is scaled down. This result is due to the fact that the band gap and the built-in potential at the junctions are an intrinsic property (constant) of the crystalline materials (such as silicon) and are non-scalable with the further reduction in device dimensions.

When SCE becomes severe, the drain current can no longer be controlled by the gate voltage due to a so-called punch-through phenomenon that causes an increased leakage current between the source and drain. Punch-through thus causes degradation of, for example, the memory retention capability in the transfer gate of a memory cell.

Figure 2A:
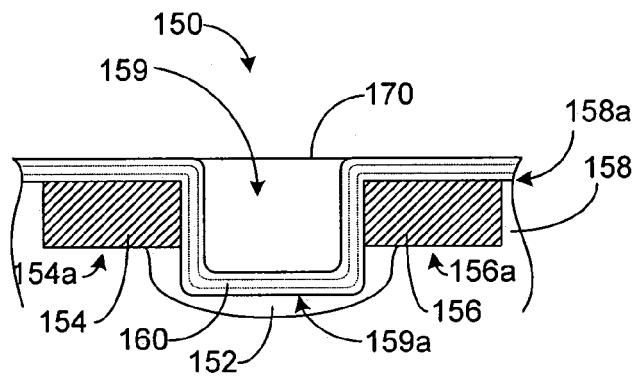
FIG. 2A is a cross-sectional view of a memory cell having a recessed channel in accordance with an embodiment of the present invention.

Referring now to FIG. 2A, a memory cell 150 in accordance with an embodiment of the present invention is illustrated. The memory cell 150 is a silicon-oxide-nitride-oxide-silicon (SONOS) device and includes a lightly doped P-conductivity channel region 152 disposed below an N-conductivity source region 154 and an N-conductivity drain region 156. The source region 154 and the drain region 156 extend from the surface of a semiconductor wafer 158 to the recessed channel region 152. A trench region 159 is formed in the substrate above the recessed channel region 152 and between the source region 154 and the drain region 156. As will be discussed in more detail below, the floor 159a of the trench region 159 is below the bottom 154a of the source region 154 and the bottom 156a of the drain region 156. A gate dielectric layer 160 is formed along the bottom and sidewalls of the trench region 159 and thus maintains the "trench shape" of the trench region 159 as illustrated in FIG. 2A, for example. The gate dielectric layer 160 has a thickness on the order of 220 Angstroms to 270 Angstroms, for example.

Figure 2B:
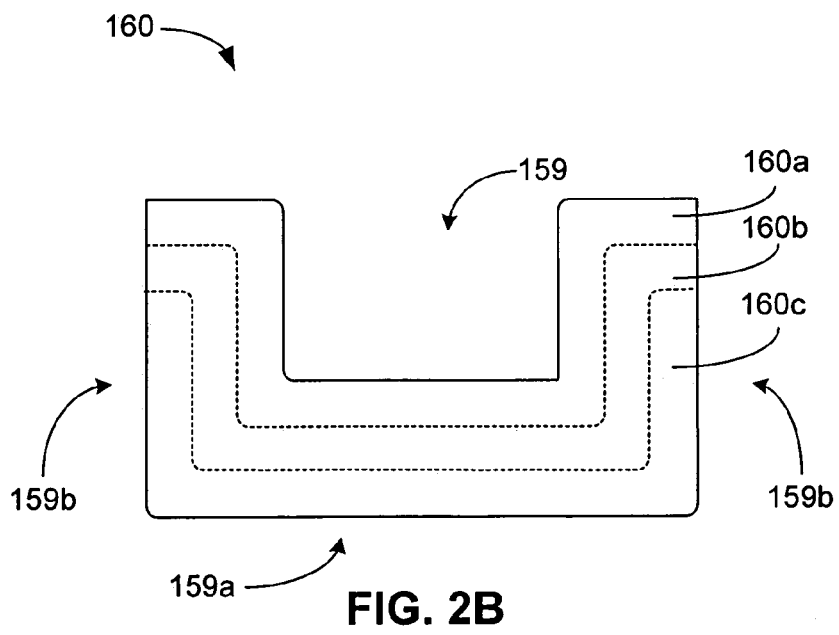
FIG. 2B is a cross-sectional view showing the Oxide-Nitride-Oxide (ONO) layer of the gate dielectric layer in accordance with the embodiment illustrated in FIG. 2A.

The gate dielectric layer 160 includes two insulating layers 160a, 160c, and a charge trapping layer 160b therebetween, as shown in FIG. 2B. In one embodiment, the gate dielectric layer 160 is an oxide-nitride-oxide (ONO) layer. The gate dielectric layer 160 is formed in the trench region 159 such that the insulating layers 160a, 160c insulate the charge trapping layer 160b both above and below the gate dielectric layer 160. For example, along the floor 159a of the trench region 159, each layer 160a, 160b, 160c is substantially parallel to the floor 159a. As the gate dielectric layer 160 is formed along the side walls 159b of the trench region 159, each layer 160a, 160b, 160c is substantially parallel to the side walls 159b. As the gate dielectric layer is formed over the top surface 158a of the semiconductor wafer 158, each layer 160a, 160b, 160c is formed substantially parallel to the top surface 158a of the semiconductor wafer 158. Furthermore, the gate dielectric layer 160 may extend over the source region 154 and drain region 156 of the memory cell 150. The gate dielectric layer 160 may comprise, for example, any standard-K or high-K dielectric material. As used herein, "standard-K dielectric material" refers to a material, or stack of materials, having a relative permittivity below 10, while "high-K dielectric material" refers to a material, or stack of materials, having a relative permittivity of about 10 or above.

Disposed above the gate dielectric layer 160 is a control gate 170, such as, for example, a polysilicon control gate. The control gate 170 resides within the trench region 159 formed by the gate dielectric layer 160 between the source region 154 and the drain region 156.

It will be appreciated by those skilled in the art that while the memory cell 150 is implemented on a bulk silicon substrate, the invention also may be implemented using SOI technology, for example.

When comparing similarly scaled devices, the recessed channel region 152 of the present invention reduces SCE by allowing an increased channel length relative to prior art configurations. In particular, the recessed channel region 152 of the present invention is not limited to the distance between the source region 154 and drain region 156. More specifically, since the channel region 152 is below the source region 154 and drain region 156, the channel region 152 can extend beyond the confines of the source region 154 and drain region 156, e.g., under the source region and drain region.

Figure 3:
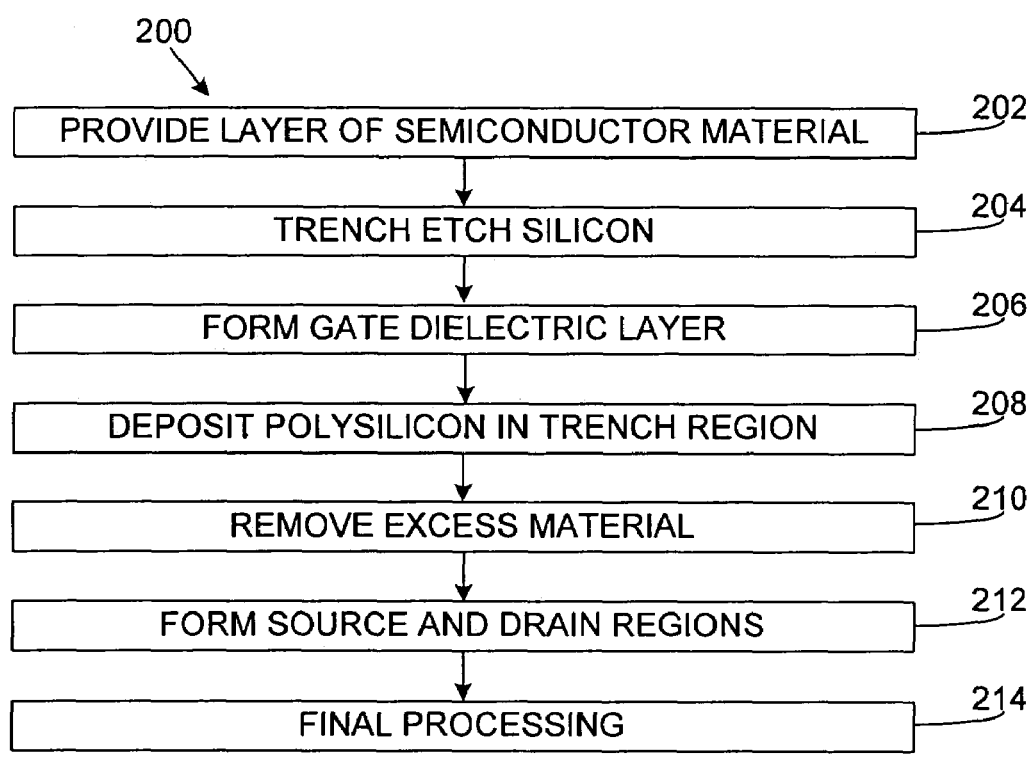
FIG. 3 is a flow chart showing exemplary processing steps in the fabrication of a memory cell in accordance with the embodiment illustrated in FIG. 2A.

Referring to the flowchart 200 of FIG. 3 in conjunction with the cross sectional diagrams of FIG. 4A–FIG. 4E, exemplary processing steps for fabricating memory cells 150 are shown.

Figure 4A:
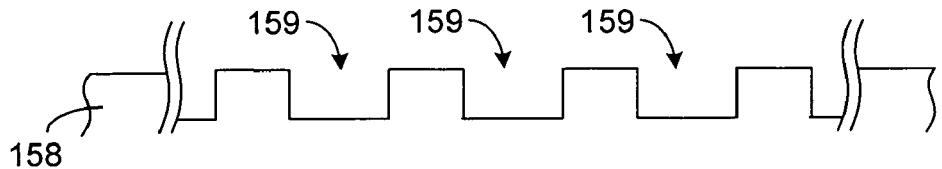
FIG. 4A is a cross section diagram showing a step in the fabrication of the memory cell in accordance with the embodiment illustrated in FIG. 2A.

The process begins with a layer of semiconductor material 158 as shown in step 202. In step 204, a trench etch is performed to form the trench regions 159 in the semiconductor material 158, as shown in FIG. 4A. For example, the silicon device layer is etched by forming a silicon nitride mask over the surface of the wafer 158 to define and expose the area corresponding to the trench regions 159. A layer of silicon nitride is then formed by depositing a layer of silicon nitride on the top surface of the semiconductor wafer 158 and patterning and etching the silicon nitride using conventional photolithography techniques to form a silicon nitride mask over the semiconductor wafer 158. Once masked, an anisotropic etch with an etching compound such as hydrogen bromide (Hbr) is used to etch the trench 159 in the semiconductor wafer 158. Each trench 159 has a depth of approximately 2000 Angstroms and a width of approximately 1000 Angstroms, for example.

Figure 4B:
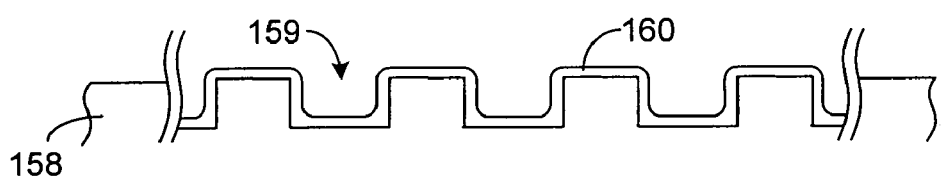
FIG. 4B is a cross section diagram showing a step in the fabrication of the memory cell in accordance with the embodiment illustrated in FIG. 2A.

In step 206, the gate dielectric layer 160 is formed. The gate dielectric layer 160 is formed to conform to the shape of the trench region 159, as shown in FIG. 4B. In one embodiment, the gate dielectric layer is formed using an ONO layer 160. The ONO layer 160 is formed using conventional deposition techniques to a thickness of about 220 to 270 Angstroms. The silicon nitride layer 160b is formed to a thickness of about 50 to 60 Angstroms, for example. The bottom silicon dioxide layer 160c is formed to a thickness of about 60 to 80 Angstroms, while the top silicon dioxide layer 160a is formed to a thickness of about 110 to 130 Angstroms, for example. As recognized in the art, the ONO layer 160 may be formed by a three-stage process including forming a first film of silicon dioxide, depositing a film of silicon nitride on the silicon dioxide, and then depositing a second film of silicon dioxide on the silicon nitride film.

Figure 4C:
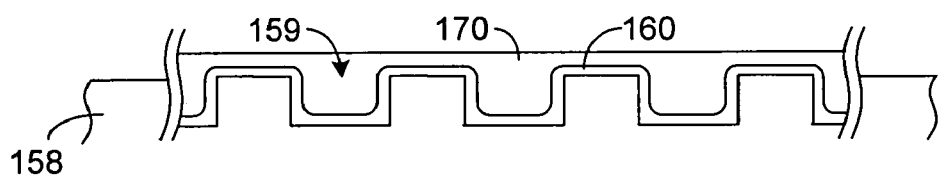
FIG. 4C is a cross section diagram showing a step in the fabrication of the memory cell in accordance with the embodiment illustrated in FIG. 2A.
Figure 4D:
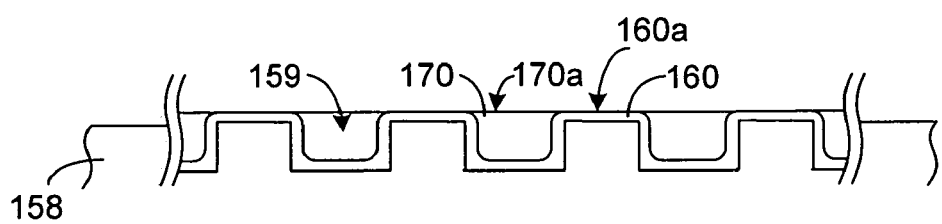
FIG. 4D is a cross section diagram showing a step in the fabrication of the memory cell in accordance with the embodiment illustrated in FIG. 2A.

In steps 208 and 210, the control gate 170 is formed as shown in FIG. 4C and FIG. 4D. The control gate 170 substantially occupies all of the remaining trench region 159. Formation of the control gate 170 includes, for example; depositing a layer of polysilicon material on the surface of the gate dielectric layer 160 using low pressure chemical vapor deposition as is known by those skilled in the art. Excess polysilicon is removed, for example, using chemical-mechanical planarization (CMP) to bring the upper surface 170a of the control gate 170 to a level that is substantially equal to the upper level 160a of the gate dielectric layer 160, as shown in FIG. 4D.

Figure 4E:
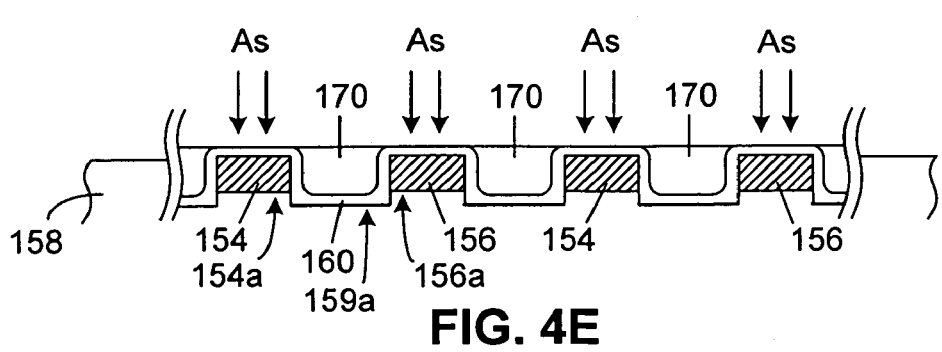
FIG. 4E is a cross section diagram showing a step in the fabrication of the memory cell in accordance with the embodiment illustrated in FIG. 2A.

In step 212, source regions 154 and drain regions 156 are formed in the semiconductor wafer 158 as shown in FIG. 4E. The source regions 154 and drain regions 156 can be formed by masking a region of the top of the semiconductor wafer 158 with a source drain channel mask and implanting N+dopants to provide the N+ source region 154 and N+drain region 156. A rapid thermal anneal (RTA) can be performed to activate the source regions 154 and drain regions 156. Processes for such implantation and activation of dopant for formation of the source regions 154 and drain regions 156 are known to one having ordinary skill in the art of integrated circuit fabrication. Although a P-channel memory cell is discussed, one skilled in the art will appreciate that the memory cell is merely exemplary and that both N-channel and/or P-channel devices can be formed on the wafer 158. In one embodiment, the source regions 154 and drain regions 156 are formed by performing an Arsenic (As) implant at a dosage of about $1 \times 10^{15}$ ions/cm$^2$ at 50 KeV using photoresist to protect areas of the semiconductor not implanted.

The bottom 154a of the source region 154 and the bottom 156a of the drain region 156 are formed above the floor 159a of the trench region 159. This provides additional channel length, which reduces SCE as the device is scaled down. In one embodiment, the bottom 154a of the source region 154 and the bottom 156a of the drain region 156 are about 700 Angstroms to 1000 Angstroms above the floor 159a of the trench 159. In another embodiment, the bottom 154a of the source region 154 and the bottom 156a of the drain region 156 is based on a percentage of the depth of the trench floor 159. For example, if the bottom of the source region and the bottom of the drain region were 55% of the depth of the trench floor, and the trench floor were 1000 Angstroms below the surface of the substrate 158, then the bottom of the source region and the bottom of the drain region would be 550 Angstroms below the surface of the substrate 158. Acceptable ranges for the depth of the bottom of the source region and the bottom of the drain region relative to the floor of the trench are about 40% to 60%, for example.

Figure 4F:
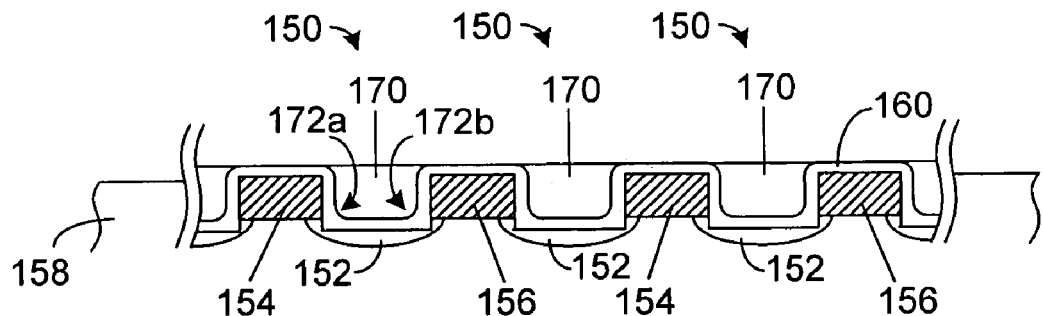
FIG. 4F is a cross section diagram showing a step in the fabrication of the memory cell in accordance with the embodiment illustrated in FIG. 2A.

The creation of the control gate 170, the source regions 154 and the drain regions 156 defines a channel region 152, which is formed below the control gate 170, the source region 154 and the drain region 156 of the memory cell 150, as illustrated in FIG. 4F, for example. The channel region 152 is controlled by a work function of the control gate 170.

Although not shown, final processing steps are performed in step 214. For example, electrode contacts may be formed for establishing electrical connection to the memory cell 150. The memory cell 150 can be provided with a gate electrode contact to establish electrical connection to the control gate 170. If needed, source and drain contacts can also be provided. Other components, such as a cap (or passivation) layer, vias, conductor lines and any other appropriate components to interconnect devices formed on the wafer 158, can also be provided.

The above described memory cell 150 is programmed by applying voltages to the control gate 170 and drain region 156 that create vertical and lateral electrical fields which accelerate electrons from the source region 154 along the length of the recessed channel 152. As the electrons move along the channel some of them gain sufficient energy to jump over the potential barrier of the bottom silicon dioxide layer 160c and become trapped in the silicon nitride layer 160b near an apex 172a, 172b of the trench region 159 as shown in FIG. 4F. The threshold voltage of the portion of the channel between the source region 154 and drain region 156 under the region of trapped charge increases as more electrons are injected into the nitride layer 160b. Exemplary program voltages include 9.8 V at the gate 170, 5 V at drain region 156 and 0 V at source region 154.

Figure 5:
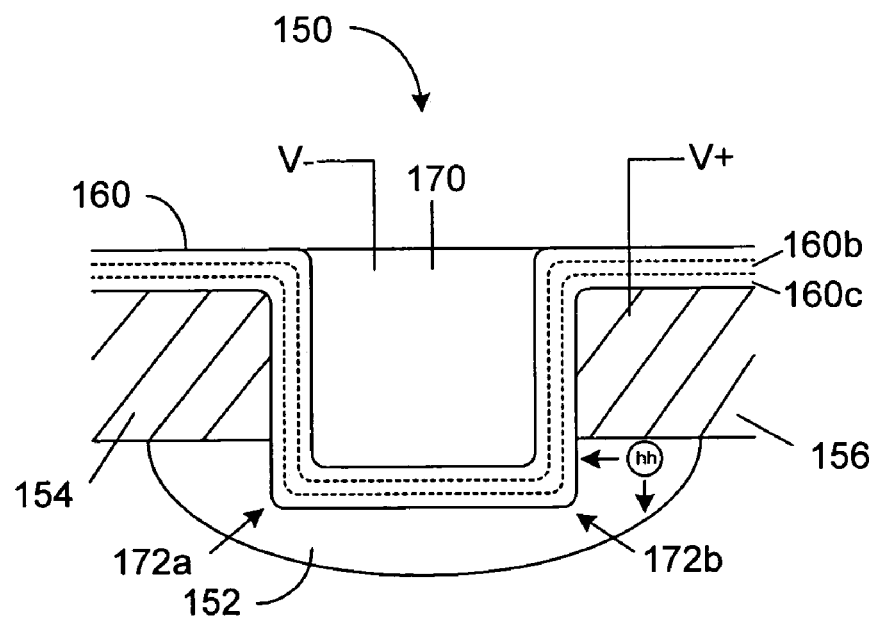
FIG. 5 is a cross section diagram showing the application of an erase voltage to the embodiment of FIG. 2A and the resulting hot hole tunneling.

The memory cell 150 can be erased by simultaneously applying a negative potential to the control gate 170 and a positive potential to the drain 156 such that hot hole tunneling occurs from the drain 156 to the charge trapping nitride layer 160b via the bottom oxide 160c. The hot hole tunneling is substantially confined to an apex 172a, 172b of the trench region 159 as shown in FIG. 5. Due to enhanced hot hole generation, the erase time can be reduced greatly, thereby reducing the damage to the ONO layer. To facilitate the erasing of the memory cell 150 using this technique, the thickness of the bottom layer 160c is suitably constructed (e.g., has a thickness of about 60 Angstroms to 80 Angstroms) to enhance the hot hole tunneling from the drain region 156 into the nitride charge trapping layer 160b. Exemplary erase voltages include −5 V at the gate 170, 5 V at drain region 156 and open at source region 154.

The conventional technique of reading the memory cell 150 is to apply read voltages to the control gate 170 and drain region 156 and to ground the source region 154. This is similar to the method of programming with the difference being that lower level voltages are applied during reading than during programming. Since the charge trapping layer is conductive, the trapped charge is distributed evenly throughout the entire charge trapping layer. In a programmed device, the threshold is therefore high for the entire channel and the process of reading becomes symmetrical. It makes no difference whether voltage is applied to the drain and the source is grounded or vice versa. Exemplary read voltages include 4 V at the gate 170, 1.4 V at drain region 156 and 0 V at source region 154.

The above described embodiment is centered around a memory cell having a recessed channel region within a semiconductor substrate. More particularly, the present embodiment implements a memory cell utilizing a recessed channel region formed below a source region, a drain region and a trench region that was formed using a trench etch. The recessed channel reduces SCE by allowing a longer channel region when compared to similarly scaled devices implementing prior art channel designs.

Figure 6A:
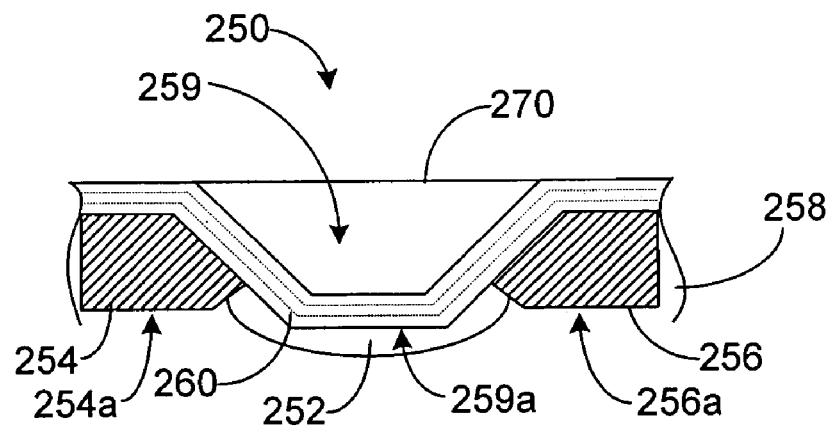
FIG. 6A is a cross-sectional view of a memory cell having a recessed channel in accordance with another embodiment of the present invention.

Referring now to FIG. 6A, a memory cell 250 in accordance with another embodiment of the present invention is illustrated. The memory cell 250 is a silicon-oxide-nitride-oxide-silicon (SONOS) device and includes a lightly doped P-conductivity channel region 252 disposed below an N-conductivity source region 254 and an N-conductivity drain region 256. The source region 254 and the drain region 256 extend from the surface of a semiconductor wafer 258 to the recessed channel region 252. A trench region 259 is formed in the substrate above the recessed channel region 252 and between the source region 254 and the drain region 256. The floor 259a of the trench region 259 is below the bottom 254a of the source region 254 and the bottom 256a of the drain region 256. The trench region 259 is formed using a directional etch approach, which will be described in more detail below. A gate dielectric layer 260 is formed along the bottom and sidewalls of the trench region 259 and thus maintains the "trench shape" of the trench region 259 as illustrated in FIG. 6A, for example. The gate dielectric layer 260 has a thickness on the order of 220 Angstroms to 270 Angstroms, for example.

Figure 6B:
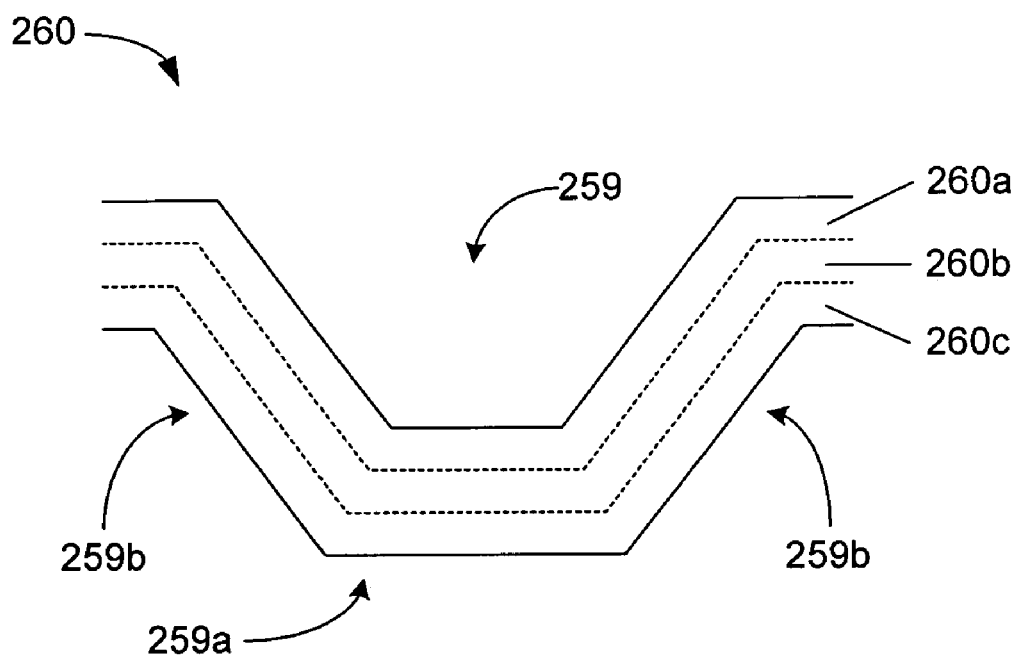
FIG. 6B is a cross-sectional view showing the Oxide-Nitride-Oxide (ONO) layer of the gate dielectric layer in accordance with the embodiment illustrated in FIG. 6A.

The gate dielectric layer 260 includes two insulating layers 260a, 260c, and a charge trapping layer 260b therebetween, as shown in FIG. 6B. In one embodiment, the gate dielectric layer 260 is an oxide-nitride-oxide (ONO) layer. The gate dielectric layer 260 is formed in the trench region 259 such that the insulating layers 260a, 260c insulate the charge trapping layer 260b both above and below the gate dielectric layer 260. For example, along the floor 259a of the trench region 259, each layer 260a, 260b, 260c is substantially parallel to the floor 259a. As the gate dielectric layer 260 is formed along the side walls 259b of the trench region 259, each layer 260a, 260b, 260c is substantially parallel to the side walls 259b. As the gate dielectric layer is formed over the top surface 258a of the semiconductor wafer 258, each layer 260a, 260b, 260c is formed substantially parallel to the top surface 258a of the semiconductor wafer 258. Furthermore, the gate dielectric layer 260 may extend over the source region 254 and drain region 256 of the memory cell 250. The gate dielectric layer 260 may comprise, for example, any standard-K or high-K dielectric material.

Disposed above the gate dielectric layer 260 is a control gate 270, such as, for example, a polysilicon control gate. The control gate 270 resides within the trench region 259 formed by the gate dielectric layer 260 between the source region 254 and the drain region 256.

Figure 7:
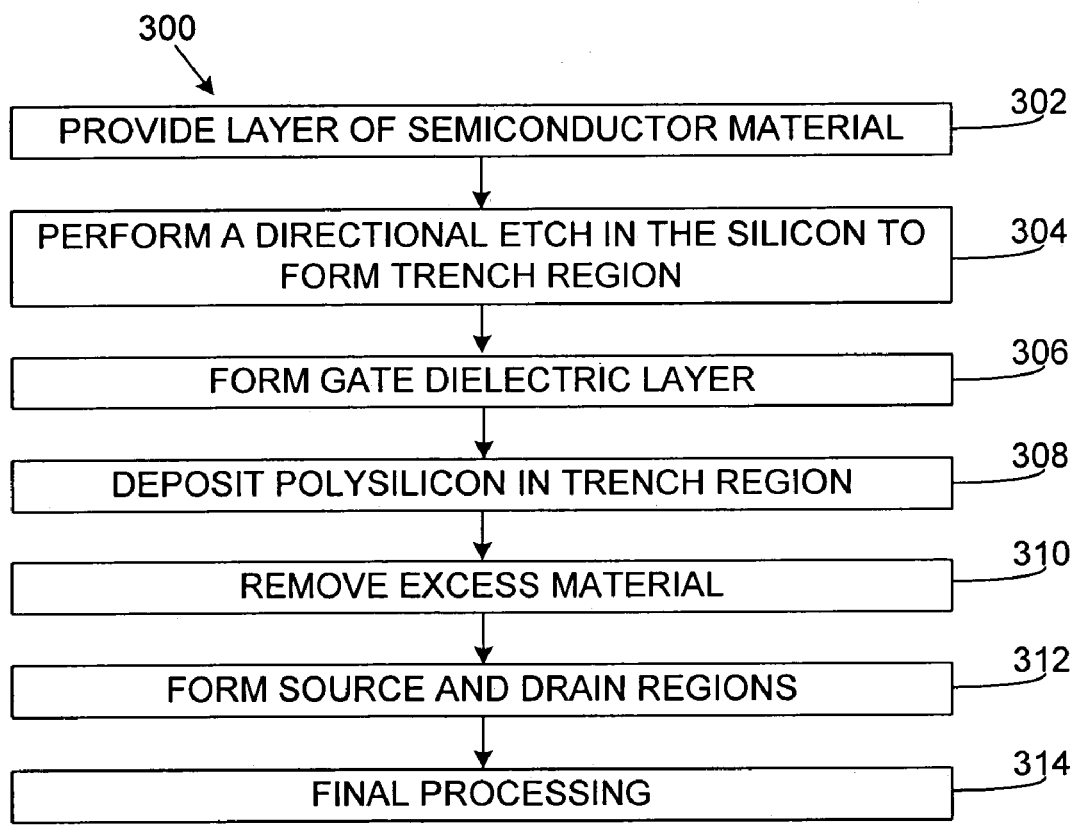
FIG. 7 is a flow chart showing exemplary processing steps in the fabrication of a memory cell in accordance with the embodiment illustrated in FIG. 6A.

Referring to the flow chart 300 of FIG. 7 in conjunction with the cross sectional diagrams of FIG. 8A–FIG. 8F, processing steps for fabricating memory cells 250 are shown.

Figure 8A:
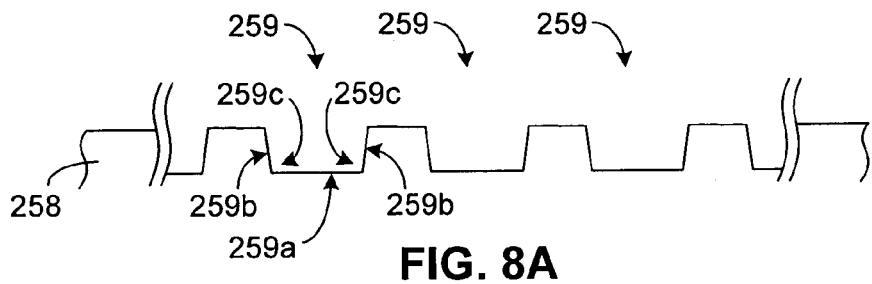
FIG. 8A is a cross section diagram showing a step in the fabrication of the memory cell in accordance with the embodiment illustrated in FIG. 6A.

The process begins with a layer of semiconductor material 258 as shown in step 302. In step 304, a directional etchant is used to form trench regions 259 in the semiconductor material 258, as shown in FIG. 8A. For example, a photoresist is applied and selectively exposed to provide a mask for the directional etching of the trenches 259. A directional etchant, such as a reactive ion etch (RIE), can be used to etch the silicon device layer, thus forming trenches 259 in the substrate 258. Each trench 259 has an aspect ratio of approximately 100:1, with a depth of approximately 2000 Angstroms and a width of approximately 1000 Angstroms, for example. The directional etch produces trench sidewalls 259b having an angle 259c relative to the trench floor 259a that is greater than 90 degrees.

Figure 8B:
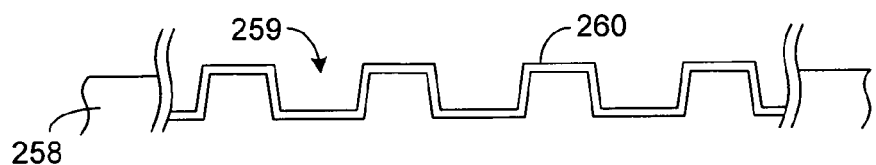
FIG. 8B is a cross section diagram showing a step in the fabrication of the memory cell in accordance with the embodiment illustrated in FIG. 6A.

In step 306, the gate dielectric layer 260 is formed. The gate dielectric layer 260 is formed to conform to the shape of the trench region 259, as shown in FIG. 8B. In one embodiment, the gate dielectric layer is formed using an ONO layer 260. The ONO layer 260 is formed using conventional deposition techniques to a thickness of about 220 to 270 Angstroms. The silicon nitride layer 260b is formed to a thickness of about 50 to 60 Angstroms, for example. The bottom silicon dioxide layer 260c is formed to a thickness of about 60 to 80 Angstroms, while the top silicon dioxide layer 260a is formed to a thickness of about 110 to 130 Angstroms, for example.

Figure 8C:
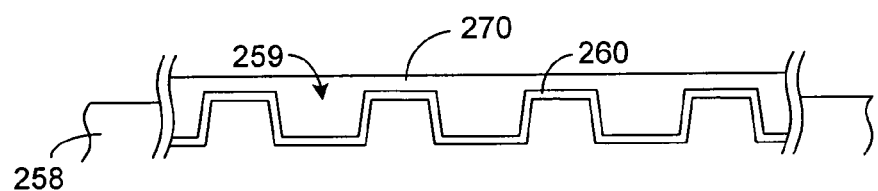
FIG. 8C is a cross section diagram showing a step in the fabrication of the memory cell in accordance with the embodiment illustrated in FIG. 6A.
Figure 8D:
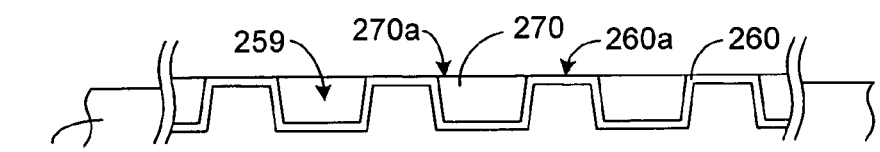
FIG. 8D is a cross section diagram showing a step in the fabrication of the memory cell in accordance with the embodiment illustrated in FIG. 6A.

In steps 308 and 310, the control gate 270 is formed as shown in FIG. 8C and FIG. 8D. The control gate 270 substantially occupies all of the remaining trench region 259. Formation of the control gate 270 includes, for example, depositing a layer of polysilicon material on the surface of the gate dielectric layer 260 using low pressure chemical vapor deposition as is known by those skilled in the art. Excess polysilicon is removed, for example, using chemical-mechanical planarization (CMP) to bring the upper surface 270a of the control gate 270 to a level that is substantially equal to the upper level 260a of the gate dielectric layer 260 as shown in FIG. 8D.

Figure 8E:
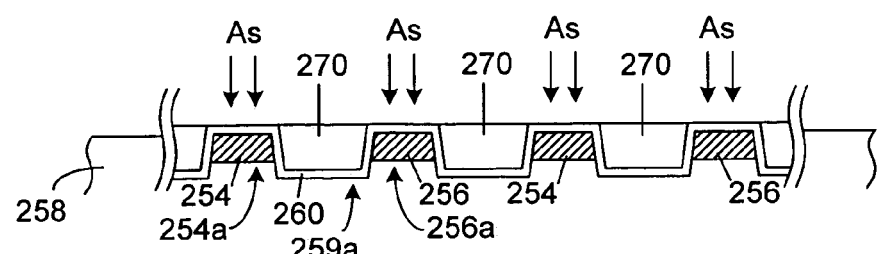
FIG. 8E is a cross section diagram showing a step in the fabrication of the memory cell in accordance with the embodiment illustrated in FIG. 6A.

In step 312, source regions 254 and drain regions 256 are formed in the semiconductor wafer 258 as shown in FIG. 8E. The source regions 254 and drain regions 256 can be formed by masking a region of the top of the semiconductor wafer 258 with a source drain channel mask and implanting N+ dopants to provide the N+ source region 254 and N+ drain region 256. A rapid thermal anneal (RTA) can be performed to activate the source regions 254 and drain regions 256. Although a P-channel memory cell is discussed, one skilled in the art will appreciate that the memory cell is merely exemplary and that both N-channel and/or P-channel devices can be formed on the wafer 258. In one embodiment, the source regions 254 and drain regions 256 are formed by performing an Arsenic (As) implant at a dosage of about $1\times10^{15}$ ions/cm$^2$ at 50 KeV using photoresist to protect areas of the semiconductor not implanted.

The bottom 254a of the source region 254 and the bottom 256a of the drain region 256 are formed above the floor 259a of the trench region 259. This provides additional channel length, which reduces SCE as the device is scaled down. In one embodiment, the bottom 254a of the source region 254 and the bottom 256a of the drain region 256 are about 700 Angstroms to 1000 Angstroms above the floor 259a of the trench 259. In another embodiment, the bottom 254a of the source region 254 and the bottom 256a of the drain region 256 is based on a percentage of the depth of the trench floor 259. For example, if the bottom of the source region and the bottom of the drain region were 55% of the depth of the trench floor, and the trench floor were 1000 Angstroms below the surface of the substrate 258, then the bottom of the source region and the bottom of the drain region would be 550 Angstroms below the surface of the substrate 258. Acceptable ranges for the depth of the bottom of the source region and the bottom of the drain region relative to the floor of the trench are about 40% to 60%, for example.

Figure 8F:
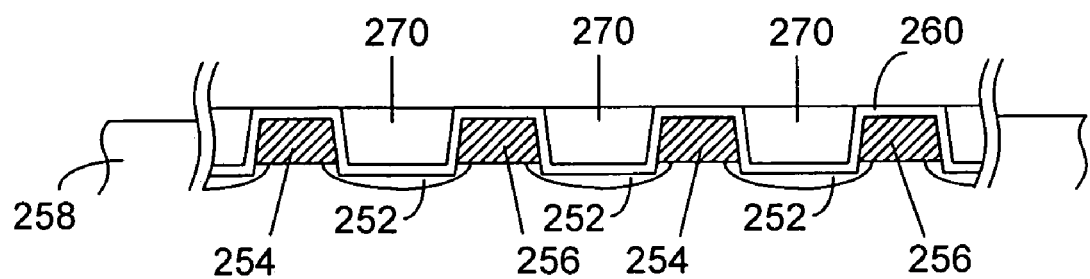
FIG. 8F is a cross section diagram showing a step in the fabrication of the memory cell in accordance with the embodiment illustrated in FIG. 6A.

The creation of the control gate 270, the source regions 254 and the drain regions 256 defines a channel region 252, which is formed below the control gate 270, the source region 254 and the drain region 256 of the memory cell 250, as illustrated in FIG. 8F, for example. The channel region 252 is controlled by a work function of the control gate 270.

Although not shown, final processing steps are performed in step 314. For example, electrode contacts may be formed for establishing electrical connection to the memory cell 250. The memory cell 250 can be provided with a gate electrode contact to establish electrical connection to the control gate 270. If needed, source and drain contacts can also be provided. Other components, such as a cap (or passivation) layer, vias, conductor lines and any other appropriate components to interconnect devices formed on the wafer 258, can also be provided.

The memory cell illustrated in FIG. 6A can be programmed, erased and read using the same or similar voltages employed for the embodiment illustrated in FIG. 2A. For example, the memory cell 250 can be programmed by applying 9.8 volts to the control gate 270, 5 volts to the drain region 256, and 0 volts to the source region 254. A read operation may be performed by grounding the source region 254 (0 volts) and applying 4 volts to the control gate 270 and 1.4 volts to the drain region 256. An erase operation may be performed by applying −5 volts to the control gate 270, 5 volts to the drain region 256 and open at the source region 254, thus causing hot hole tunneling to occur from the drain 256 to the charge trapping nitride layer 260b.

The above described embodiment is centered around a memory cell having a recessed channel region within a semiconductor substrate. More particularly, the present embodiment implements a memory cell utilizing a recessed channel region formed below a source region, a drain region and a trench region that was formed using a directional etch. The recessed channel reduces SCE by allowing a longer channel region when compared to similarly scaled devices implementing prior art channel designs.

While particular embodiments of the invention have been described in detail, it is understood that the invention is not limited correspondingly in scope, but includes all changes, modifications and equivalents coming within the spirit and terms of the claims appended hereto.

What is claimed is:

1. A memory cell, comprising:
a semiconductor substrate having at least one trench formed in a surface thereof;
a recessed channel region of a first conductivity type semiconductor formed in the semiconductor substrate below each trench;
a source region and a drain region both of a second conductivity type semiconductor formed in the semiconductor substrate on opposing sides of each trench, wherein a bottom of the source region and a bottom of the drain region are above a floor of the trench;
a gate dielectric layer formed on the semiconductor substrate, said gate dielectric layer being formed along the bottom and sidewalls of the trench; and
a control gate formed over the gate dielectric layer above the recessed channel region, wherein an upper surface of the control gate is substantially at the same level as an upper surface of the gate dielectric layer over the source and drain, and
wherein the bottom of the source region and the bottom of the drain region are at a depth from a surface of the semiconductor substrate of about 40 percent to 60 percent of the depth of the floor of the trench from the surface of the semiconductor substrate.

2. The memory cell of claim 1, wherein the bottom of the source region and the bottom of the drain region are about 700 Angstroms to 1000 Angstroms above the floor of the trench.

3. The memory cell of claim 1, wherein the at least one trench sidewall is formed at an angle greater than 90 degrees with respect to a trench floor.

4. The memory cell of claim 1, wherein the thickness of the gate dielectric layer between the top surface of the gate dielectric layer and the bottom surface of the gate dielectric layer is between 220 and 270 angstroms in thickness.

5. The memory cell of claim 1, wherein the semiconductor substrate is a silicon-on-insulator (SOI) semiconductor substrate.

6. The memory cell of claim 1, wherein the semiconductor substrate is a bulk silicon semiconductor substrate.

7. The memory cell of claim 1, wherein the memory cell is a silicon-oxide-nitride-oxide-silicon (SONOS) device.

8. The memory cell of claim 7, wherein the gate dielectric layer is an oxide-nitride-oxide (ONO) layer.

9. The memory cell of claim 8, wherein the ONO layer is formed in the at least one trench region so as to insulate the nitride layer from a floor region and a plurality of sidewall regions within the trench region.

10. The memory cell of claim 8, wherein a bottom oxide layer of the ONO layer has a thickness of about 60 Angstroms to 80 Angstroms.

11. The memory cell of claim 1, wherein the gate dielectric layer extends above the source region and the drain region.

12. The memory cell of claim 1, wherein the control gate resides in the at least one trench.

13. The memory cell of claim 1, wherein the gate dielectric layer is comprised of a high-K dielectric material.

14. The memory cell of claim 1, wherein the gate dielectric layer is comprised of a standard-K dielectric material.

15. The memory cell of claim 1, wherein the at least one trench has an aspect ratio of about 100:1.

16. The memory cell of claim 1, wherein the at least one trench is substantially rectangular.

17. A method of fabricating a memory cell, comprising the steps of:

forming at least one trench in a semiconductor substrate;

forming a recessed channel region of a first conductivity type semiconductor in the semiconductor substrate below each trench;

forming a source region and a drain region both of a second conductivity type semiconductor in the semiconductor substrate on opposing sides of each trench, wherein a bottom of the source region and a bottom of the drain region are above a floor of the trench;

forming a gate dielectric layer on the semiconductor substrate, said gate dielectric layer being formed along the bottom and sidewalls of the trench; and forming a control gate over the gate dielectric layer above the recessed channel region, wherein an upper surface of the control gate is substantially at the same level as an upper surface of the gate dielectric layer over the source and drain, and wherein the step of forming the source region and the drain region includes forming the bottom of the source region and the bottom of the drain region at a depth from a surface of the semiconductor substrate of about 40 percent to 60 percent of the depth of the floor of the trench from the surface of the semiconductor substrate.

18. The method of claim 17, wherein the step of forming the source region and the drain region includes forming the bottom of the source region and the bottom of the drain region about 700 Angstroms to 1000 Angstroms above the floor of the trench.

19. The method of claim 17, wherein the step of forming at least one trench includes forming at least one trench side wall at an angle greater than 90 degrees with respect to a trench floor.

20. The method of claim 19, wherein the step of forming at least one trench side wall at an angle greater than 90 degrees with respect to a trench floor includes performing a directional etch.

21. The method of claim 17, further comprising the step of:

forming the gate dielectric layer between the top surface of the gate dielectric layer and the bottom surface of the gate dielectric layer between 220 and 270 angstroms in thickness.

22. The method of claim 17, further comprising the step of:

using a silicon-on-insulator (SOI) semiconductor substrate as the semiconductor substrate.

23. The method of claim 17, further comprising the step of:

using a bulk silicon semiconductor substrate as the semiconductor substrate.

24. The method of claim 17, further comprising the step of:

using an oxide-nitride-oxide (ONO) layer to form the gate dielectric layer.

25. The method of claim 24, further comprising the step of:

forming the ONO layer in the trench region so as to insulate the nitride layer from a floor region and a plurality of sidewall regions within the trench region.

26. The method of claim 24, further comprising the step of:

forming a bottom oxide layer of the ONO layer to a thickness of about 60 Angstroms to 80 Angstroms.

27. The method of claim 17, further comprising the step of:

extending the gate dielectric layer above the source region and the drain region.

28. The method of claim 17, further comprising the step of:

forming the control gate in the at least one trench.

29. The method of claim 17, further comprising the step of:

using a standard-K dielectric material to form the gate dielectric layer.

30. The method of claim 17, further comprising the step of:

using a high-K dielectric material to form the gate dielectric layer.

31. The method of claim 17, further comprising the step of:

forming the at least one trench to have an aspect ration of about 100:1.

32. The method of claim 17, wherein the step of forming an upper surface of the control gate substantially at the same level as an upper surface of the gate dielectric layer includes using chemical-mechanical planarization.

33. The method of claim 17, wherein the step of forming at least one trench in a semiconductor substrate includes using a directional etchant.

34. The method of claim 33, wherein the step of using a directional etchant includes a reactive ion etch.

35. The method of claim 17, wherein the forming at least one trench includes forming the trench to be substantially rectangular.

* * * * *